United States Patent
Maleville et al.

(10) Patent No.: US 7,235,461 B2
(45) Date of Patent: Jun. 26, 2007

(54) METHOD FOR BONDING SEMICONDUCTOR STRUCTURES TOGETHER

(75) Inventors: Christophe Maleville, La Terrasse (FR); Corinne Maunand Tussot, Meylan (FR); Olivier Rayssac, Grenoble (FR); Sébastien Kerdiles, Saint-Ismier (FR); Benjamin Scarfogliere, Grenoble (FR); Hubert Moriceau, Saint Egrève (FR); Christophe Morales, Pont de Claix (FR)

(73) Assignees: S.O.I.Tec Silicon on Insulator Technologies, Bernin (FR); Commissariat à l'Energie Atomique (CEA), Paris (FR)

( * ) Notice: Subject to any disclaimer, the term of this patent is extended or adjusted under 35 U.S.C. 154(b) by 177 days.

(21) Appl. No.: 10/832,267

(22) Filed: Apr. 27, 2004

(65) Prior Publication Data

US 2004/0248379 A1    Dec. 9, 2004

Related U.S. Application Data

(60) Provisional application No. 60/486,455, filed on Jul. 10, 2003.

(30) Foreign Application Priority Data

Apr. 29, 2003 (FR) .................................. 03 05236

(51) Int. Cl.
*H01L 21/46* (2006.01)

(52) U.S. Cl. ..................... 438/455; 438/459

(58) Field of Classification Search ................ 438/455, 438/459
See application file for complete search history.

(56) References Cited

U.S. PATENT DOCUMENTS

| | | | |
|---|---|---|---|
| 5,131,968 A | 7/1992 | Wells et al. | 156/153 |
| 5,374,564 A | 12/1994 | Bruel | 437/24 |
| 5,994,207 A | 11/1999 | Henley et al. | 438/515 |
| RE36,890 E | 10/2000 | Wells et al. | 156/153 |
| 6,388,290 B1 | 5/2002 | Celler et al. | 257/350 |
| 6,911,375 B2 * | 6/2005 | Guarini et al. | 438/455 |
| 2004/0035525 A1 * | 2/2004 | Yokokawa et al. | 156/281 |
| 2004/0241958 A1 * | 12/2004 | Guarini et al. | 438/455 |
| 2005/0026391 A1 * | 2/2005 | Ghyselen et al. | 438/455 |

FOREIGN PATENT DOCUMENTS

EP    0 969 500 A    1/2000

OTHER PUBLICATIONS

O. Rayssac et al., "Influence Of Surface Characteristics On Direct Wafer Bonding", Proceedings of the 2nd International Conference on Materials for Microelectronics, IOM Communication, p. 183, (1998).

(Continued)

*Primary Examiner*—Zandra V. Smith
*Assistant Examiner*—Toniae M. Thomas
(74) *Attorney, Agent, or Firm*—Winston & Strawn LLP

(57) ABSTRACT

A method for bonding semiconductor structures together is described. The technique includes providing a bonding surface on each of two semiconductor structures, brushing a bonding surface of at least one of the structures to remove contaminants and to activate hydroxyl groups on the bonding surface to enhance hydrophilicity and to facilitate molecular bonding of the structures, and joining the bonding surfaces together by molecular bonding to form a composite structure.

19 Claims, 4 Drawing Sheets

OTHER PUBLICATIONS

T. Suni et al., "Effects of plasma activation on hydrophilic bonding of Si and $SiO_2$", Journal of Electromechanical Society 149, G348, (2002).

R. Stengl et al, "A Model for the Silicon Wafer Bonding Process", Japanese Journal of Applied Physics, vol. 28, p. 1735-1741, (1989).

Sanz-Velaco et al, "Room Temperature Wafer Bonding Using Oxygen Plasma Treatment In Reactive Ion Etchers With And Without Inductively Coupled Plasma", Journal of Electrochemical Society, vol. 150, No. 2), p. G155-G162 (2003).

W. P. Maszara, "Silicon-On-Insulator by Wafer Bonding", J. Electrochem. Soc., vol. 138, No. 1, p. 341-347 (1991).

G.A.C.M.. Spierlings et al., "Surface-Related Phenomena In The Direct Bonding Of Silicon And Fused-Silica Wafer Pairs", Phillips Journal of Research, vol. 49, No. 1/2, pp. 47-63 (1995).

* cited by examiner

METHOD FOR BONDING SEMICONDUCTOR STRUCTURES TOGETHER

This application claims the benefit of Provisional application No. 60/486,455 filed Jul. 10, 2003, the entire content of which is expressly incorporated herein by reference thereto.

BACKGROUND ART

This invention relates to methods for bonding two semiconductor structures together in order to make structures for microelectronics, optics or optoelectronics. In particular, the invention relates to preparing bonding surfaces of the structures.

Wafer surfaces have to be cleaned before bonding in order to obtain good bonding results. For example, it is known to subject wafer surfaces to one or more chemical treatments, such as an RCA treatment, to remove isolated particles and metallic and organic contaminants. Another known chemical surface treatment utilizes dry ozone to clean, wherein the dry ozone is obtained by transforming atmospheric oxygen into ozone under the action of TV rays. The dry ozone reacts with hydrocarbon surface contaminants and eliminates them by creating volatile species.

Other techniques for preparing wafer surfaces for bonding are of the mechanical type. Friction forces can be applied to the surface of the wafers to remove isolated particles. For example, lightweight polishing or brushing may be used.

If there is no particulate, no organic residue and no surface defects, the bonding quality between wafers depends on the adhesive technique used to bond the wafers. For example, two wafers can be bonded together by molecular bonding, at least initially. Specific preliminary treatments can advantageously be used to improve the molecular bonding (and therefore the bonding quality) between two wafers. The improvement in the bond usually corresponds to an increase in the mechanical strength and/or an increase in the quality of the bonding interface. Thus, an increase in the mechanical strength of the bond between the wafers can be achieved if the hydrophilic properties of the surfaces to be bonded are improved (to learn more, one can refer to, for example, the document entitled "Influence of Surface Characteristics on Direct Wafer Bonding" by O. Rayssac et al. "Proceedings of the 2$^{nd}$ International Conference on Materials for Microelectronics", IOM Communications, p. 183, 1998).

For example, it is known to prepare wafers before bonding by using chemical solutions, such as a solution containing ozone or a solution containing a mix of sulphuric acid and oxygenated water (also called an SPM—"Sulfuric Peroxide Mixture") solution. Use of such solutions facilitate the removal of hydrocarbon contaminants and also improves the wettability of the surface of the wafers by improving the hydrophilic properties, and therefore increases the bonding energy.

In general, RCA type solutions are used for cleaning purposes, and to increase the hydrophilic properties of surfaces to be bonded by molecular bonding. After a chemical treatment, at least one of the surfaces to be bonded may also be exposed to a plasma treatment in order to increase the forces that will bind the two wafers together when they are brought into contact. The surfaces may be brought into contact and possibly accompanied or followed by a heat treatment to reinforce the bonding. Further information may be found in the article, for example, by T. Suni et al., Journal of Electromechanical Society 149, G348, 2002 "Effects of plasma activation on hydrophilic bonding of Si and $SiO_2$".

A mechanical chemical polishing process, such as Chemical Mechanical Planarization (CMP), may be used to activate bonding surfaces if it is used in a specific chemical environment. Thus, for example, a CMP in a basic medium on silicon or silicon-oxide surfaces can activate such surfaces to reinforce their molecular bonding characteristics. Such operation is described in an article by R. Stengl, T. Tang and U. Gosële entitled "A Model for the Silicon Wafer Bonding Process" (Japanese Journal of Applied Physics, 28, p. 1735, 1989). A brushing step may then optionally be applied in order to eliminate particles resulting from the polishing. However, even slight polishing is abrasive, and this can thus affect the quality of the treated material. Thus, the previously discussed treatments are not always sufficient. In particular, such treatments are insufficient if followed by other treatments that reduce the surface quality and/or activate properties that adversely affect the surface quality, or if a long duration separates the treatments from the bonding step, because a waiting period allows contaminants and gaseous residues in the atmosphere to adhere to the surface.

SUMMARY OF THE INVENTION

The present invention pertains to a process of bonding two semiconductor structures together at two corresponding bonding surfaces, for application in the electronics, optics and optoelectronics fields. In particular, the technique includes providing a bonding surface on each of two semiconductor structures, brushing a bonding surface of at least one of the structures to remove contaminants and to activate hydroxyl groups on the bonding surface to enhance hydrophilicity and to facilitate molecular bonding of the structures, and joining the bonding surfaces together by molecular bonding to form a composite structure. This method implements steps for preparing the wafer surface which allow improved activation of the wafer surface compared to what was possible according to the prior art.

In an advantageous implementation, both bonding surfaces are brushed to facilitate bonding. The bonding surface may be a part of a bonding layer that is provided on the semiconductor surface before the brushing step. The resulting structure can also be heat treated to increase the bonding links.

An advantageous variation of the invention also includes forming a zone of weakness in one of the semiconductor structures at a predetermined depth below the bonding surface. The depth corresponds approximately to the thickness of a thin layer. Next, the thin layer is detached from the donor wafer at the zone of weakness to form the semiconductor structure. The zone of weakness may be formed by at least one of implanting atomic species at a predetermined depth or by forming a porous layer on the donor wafer and growing a thin layer of a predetermined thickness.

The present invention recognizes that brushing can be used not only to clean particles from a bonding surface, but can also be used to activate the surface immediately before bonding. Bonding can commence immediately after brushing without waiting. Thus, brushing has a more important role in the wafer bonding preparation process than previously recognized. Furthermore, brushing is easier, simpler, faster and more economical than other cleaning and/or surface activation techniques. Therefore, brushing may be advantageously used as the last wafer preparation step because it is simple, fast and guarantees improved bonding properties. Furthermore, brushing causes little or no damage to the surface, in contrast to that caused, for example, by mechanical abrasion or aggressive etching.

BRIEF DESCRIPTION OF THE DRAWINGS

Other aspects, purposes and advantages of the invention will become clear after reading the following description with reference to the attached drawings, in which.

DETAILED DESCRIPTION OF THE PREFERRED EMBODIMENTS

The present invention provides improved bonding between two wafers. In particular, the technique includes removing isolated particles on the surface of a wafer to be bonded (particularly chemical contaminants on the surface of the wafer to improve its hydrophilic properties), and activating the wafer surface in order to facilitate molecular bonding of the two wafers during the bonding process. The present method is also a simple, fast and economical technique. The present technique includes preparing the surface of one or two wafers to be bonded, including brushing at least one bonding surface.

Figure 1:
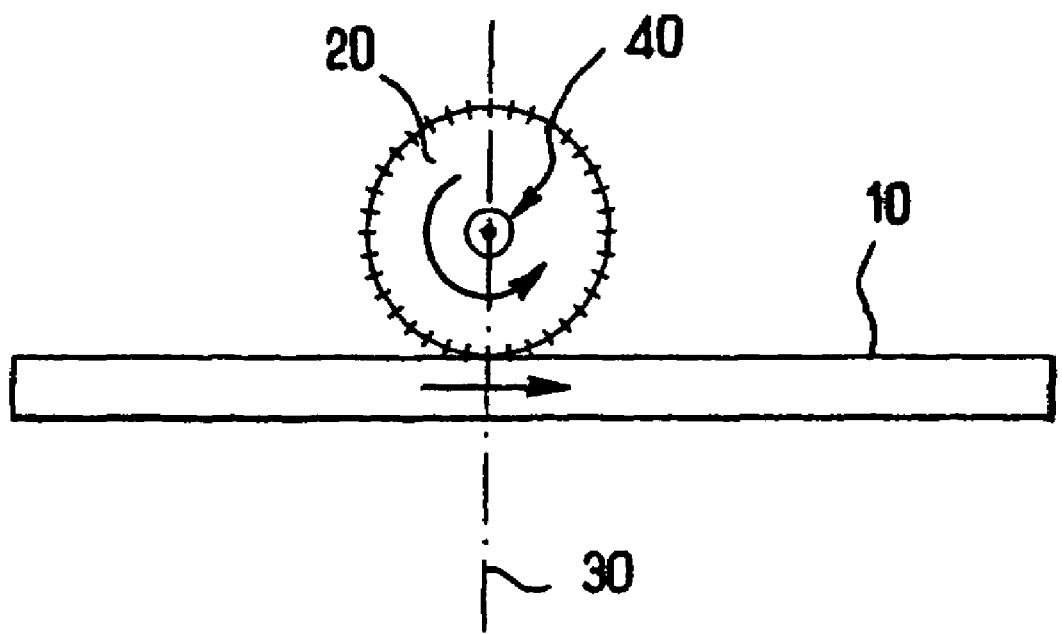
FIG. 1 is a simplified drawing of a device for brushing a surface of a wafer according to the invention.

FIG. 1 is a simplified drawing of a device for brushing a bonding surface of a wafer 10. The wafer 10 is held stably in place and is rotated about an axis 30 that is approximately perpendicular to the surface of the wafer. A brush 20 having a cylindrical shape can be rotated about an axis 40 approximately perpendicular to the axis 30. The brush 20 can also advantageously be provided with a textured material such as a polymer around its peripheral surface that will come into low-pressure contact with the surface of the wafer 10.

An adapted chemical species or ultra pure water can be injected onto the surface of the wafer to accompany the brushing. The liquid can be injected, for example, through a cavity formed at the axis 40 and/or by jets (not shown) positioned above the brush 20.

The wafer 10 is rotated about the axis 30 while the brush 20 is rotated about the axis 40. Thus, the brush 20 uniformly brushes the entire surface of the wafer 10 resulting in the uniform removal of particles from the surface of the wafer.

Before brushing, one or more of the following treatments are advantageously applied, either individually or in combination:

(1) wet chemical cleaning;
(2) dry chemical cleaning;
(3) plasma treatment;
(4) mechanical-chemical polishing.

The wet chemical cleaning treatment (1) may be an RCA treatment (comprising a treatment using a SC1 solution containing ammonium hydroxide ($NH_4OH$), hydrogen peroxide ($H_2O_2$) and de-ionized water, followed by a treatment using a SC2 solution containing hydrochloric acid (HCl) and hydrogen peroxide ($H_2O_2$) and deionised water). The wet chemical treatment may also include successive rinsing and/or ozone-type wet treatments and/or SPM treatments and/or hydrochloric acid treatments, or other solutions suitable for cleaning and/or activating a bonding surface. For example, a solution containing ozone could be utilized followed by an RCA treatment, and then another ozone solution to treat the wafer. In another example, it would be possible to use an ozone solution, followed by a hydrofluoric acid and another ozone solution to treat the wafer 10.

The humidity can be controlled by dipping the wafer 10 in a bath or by injecting droplets onto the wafer 10. Optionally, sonic waves can be emitted simultaneously with the chemical treatment to help remove isolated particles from the bonding surface.

The dry cleaning treatment (2) can be used alone or as a complement or alternate to wet cleaning, and is mainly used to eliminate contamination with hydrocarbons. Dry cleaning consists of using volatile hydrocarbons after they have reacted with dry ozone, the dry ozone being obtained in the atmosphere as a result of transforming oxygen under UV radiation. Dry ozone can be obtained by using a mercury lamp that emits UV rays to cause a chemical reaction to transform oxygen into ozone in an ozone containment unit.

A plasma treatment (3) activates the bonding surface of the wafer 10, and is particularly useful when bonding is accompanied or followed by heat treatment. The surface can be exposed to a plasma treatment that is based on oxygen, nitrogen, argon or other gases. The equipment used for this purpose may be initially designed for Reactive Ion Etching (RIE) with capacitive coupling, or for Inductively Coupled Plasma (ICP). For more information, the reader can refer to the document by Sanz-Velasco et al, entitled "Room temperature wafer bonding using oxygen plasma treatment in reactive ion etchers with and without inductively coupled plasma" (Journal of Electrochemical Society 150, G155, 2003). Other atmospheric plasma equipment, or equipment with an Electron Cyclotron Resonance (ECR) type source or an helicon type source, or other sources can also be used. These plasmas may also be immersed in a magnetic field to avoid diffusion of electrically charged species towards the walls of the reactor, using MERIE (Magnetically Enhanced Reactive Ion Etching) type equipment. The plasma density may be chosen to be low, medium or high (or HDP "High Density Plasma").

In practice, plasma bonding activation generally includes a prior chemical cleaning, such as an RCA cleaning, followed by exposure of the surface to a plasma treatment for a few seconds to a few minutes. Optionally, cleaning prior to plasma exposure may be applied, by rinsing with water and/or SC1 cleaning, followed possibly by drying by centrifuge, in order to remove contaminants introduced during exposure. Use of the present method, however, avoids the use of this optional step because the final brushing step is itself capable of eliminating a large percentage of the contaminants.

The treatment (4) is mechanical-chemical polishing such as a CMP. The purpose of a CMP treatment is to make the surface of the wafer 10 optimally planar by combining the following three actions:
- a macroscopic mechanical attack of the wafer 10 by means of friction forces using at least one polishing plate on at least one face of the wafer 10;
- a microscopic mechanical attack of the wafer 10 made by abrasive particles contained in a polishing solution;
- a chemical attack of the wafer 10 made by a chemical agent contained in the polishing solution.

These three actions are usually combined with a polishing solution containing abrasive particles and a chemical agent, while the polishing plate(s) rub the wafer 10.

The abrasive particle sizes are initially arranged so that they are large enough to suitably abrade the surface of the wafer 10, and secondly so that they do not abrade the surface excessively. Excessive abrading could potentially cause serious superficial damage such as scratches or "pin holes". Thus, the typical size of particles used for abrasion of silicon surfaces is on the order of 0.1 micron.

The chemical agent added to the polishing solution is usually chosen to create chemical reactions at the surface of the wafer 10 in order to weaken or even detach particles on the surface of the wafer 10. The polishing solution can thus provide additional assistance in abrading the surface.

For materials such as crystalline silicon, silica (also denoted $SiO_2$ in this description), glass and quartz, the action is predominantly chemical using a chemical agent with a basic pH, in order to encourage chemical attack. An ammonia based chemical agent can thus be chosen.

In an appropriate chemical medium such as a basic medium for the surface materials mentioned above, CMP could generate pendant bonds leading to Si—OH bonds at the surface. Therefore, CMP may have the effect of significantly increasing groups of OH ions on the polished surface to facilitate future molecular bonding between the surfaces. An appropriate surfactant may optionally be injected during or after polishing to modulate abrasive mechanical-chemical actions. Rinsing can also follow polishing to help remove residue derived from polishing.

In all cases, a brushing step after the CMP will help to evacuate particles derived from the abrasive polishing action, particularly if brushing is done while simultaneously injecting ammonia.

The following Table 1 shows different preferred processes for preparing the wafer 10 before bonding according to the present method (classed from A to L). The table includes each of the above mentioned treatments (1), (2), (3), (4) along with a brushing step. Each step is associated with a number in the table, the number corresponding to the position in a series of steps associated with the particular process considered. For example step 3 follows step 2 and precedes step 4.

TABLE 1

| Process | Wet cleaning | Dry cleaning | Mech.-chem polishing | Plasma treatment | Brushing |
|---------|--------------|--------------|----------------------|------------------|----------|
| A       |              |              |                      |                  | 1        |
| B       | 1            |              |                      |                  | 2        |
| C       |              | 1            |                      |                  | 2        |
| D       | 1            | 2            |                      |                  | 3        |
| E       |              |              | 1                    |                  | 2        |
| F       | 2            |              | 1                    |                  | 3        |
| G       | 1            |              |                      | 2                | 3        |
| H       | 1 and 3      |              |                      | 2                | 4        |
| I       | 1            | 3            |                      | 2                | 4        |
| J       |              |              | 1                    | 2                | 3        |
| K       | 3            |              | 1                    | 2                | 4        |
| L       |              | 3            | 1                    | 2                | 4        |

It should be understood that these processes according to the invention are not limited, and thus any treatment may be used before brushing that might improve the quality of the treated surface and/or create an additional activation of a surface. Such treatments may be used either individually or in combination, in sequence with other treatments. In all cases, the last surface treatment operation is a brushing step.

After brushing, the wafer 10 is preferably rotated and rinsed, and then dried by using a centrifuge.

Figure 2:
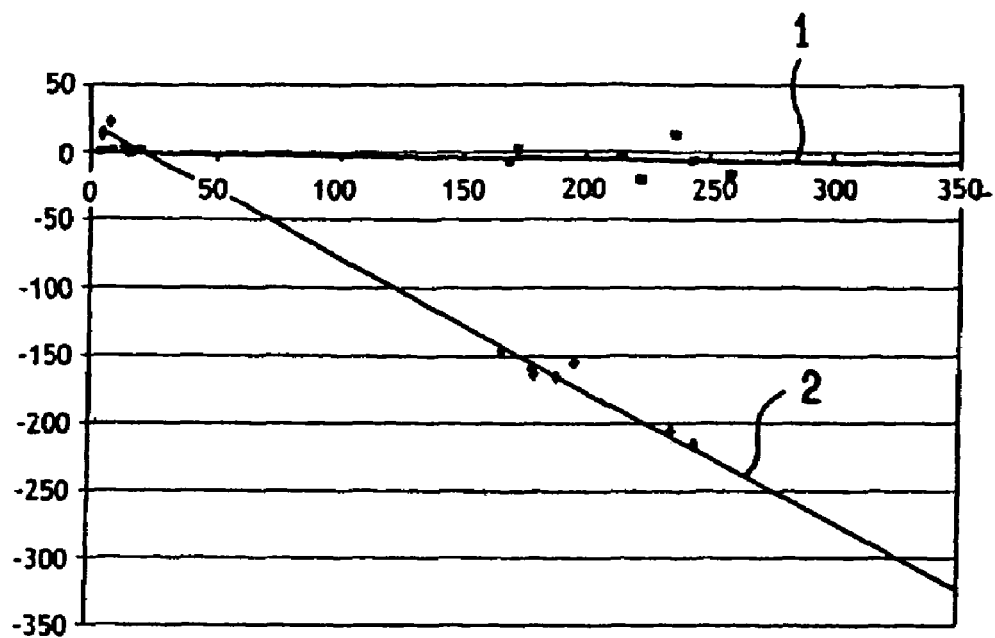
FIG. 2 is a comparative graph comparing the cleaning efficiency of the surface of a solid silicon wafer without brushing and with brushing.
Figure 3:
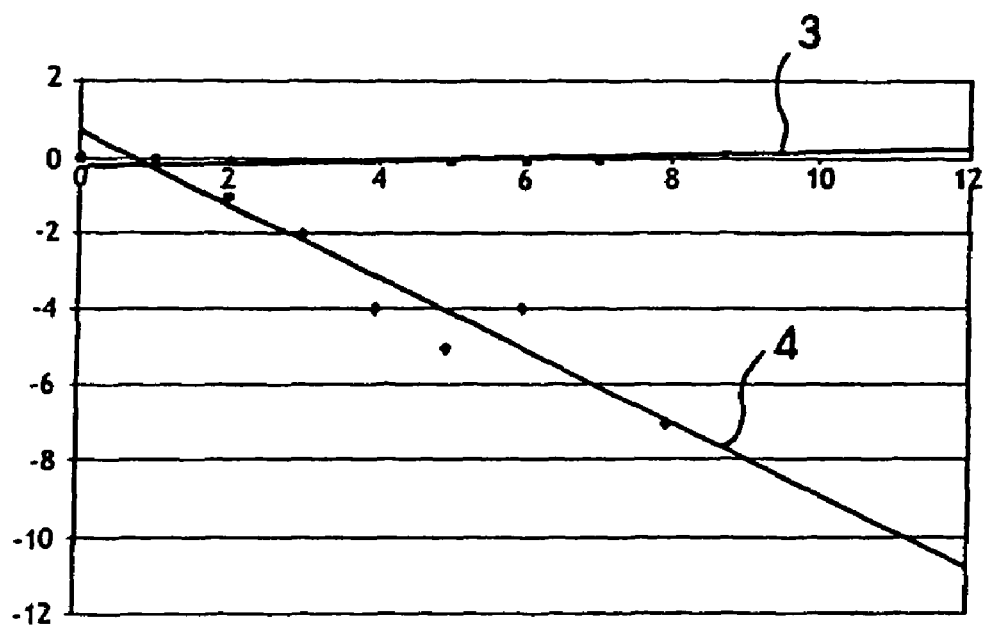
FIG. 3 is a comparative graph comparing the efficiency of cleaning of the surface of a silicon wafer covered with an oxide without brushing and with brushing.

With reference to FIGS. 2 and 3, LPD ("Light Point Defect") measurements were made on the surfaces of different wafers that were deliberately polluted or contaminated with different contaminants. LPD is a defect that is also called a bright point, and it can be detected by optical LPD measurements. An LPD measurement consists of illuminating the surface of the wafer with an incident optical wave emitted by a laser source and using an optical detector to detect light diffused by LPD defects present on the surface. Diffusion of light at the surface of the wafer 10 is associated with the number of residual particles on the surface. Consequently, light diffusion measurements supply information about the number of these residual particles.

Curves 1, 2, 3, 4 in FIGS. 2 and 3 were plotted using LPD measurement results from measurements made on the surface of the wafer 10, which are shown on the graphs by square or diamond shaped points.

The abscissas of the graphs shown in FIGS. 2 and 3 represent the number of residual particles detected before the surface of the wafer was brushed. As shown, before brushing the surfaces of the wafers had high amounts of contaminants, and therefore a large number of residual particles, which were different on the different wafers.

The ordinates of the graphs shown in FIGS. 2 and 3 plot the difference between the number of residual particles detected after brushing, and the number of residual particles detected before brushing. A value of 0 on the ordinate axis means that the amount of residual particles present before and after brushing the surface is identical.

With reference to FIG. 2, the measurements were made on a silicon wafer 10 for residual particles larger than about 0.08 micrometers. Curve 2 shows the number of residual particles removed after brushing, as compared with the value 0 on the ordinate. Therefore, the curve shows that as the amount of contaminants on the surface of the wafers increases (in other words as the values on the abscissa become higher), brushing removes more residual particles and therefore reduces the surface pollution of the wafer. Curve 1 provides information about the number of particles removed after simply rinsing the wafer 10 with ultra pure water. As shown, brushing the surface of the wafer 10 removes significantly more contaminants than simple rinsing.

With reference to FIG. 3, measurements are made on a silicon wafer 10 covered by an approximately 0.2 micron thick oxide layer, on which brushing was carried out for residual particles larger than about 0.10 micrometers. As shown, the results are qualitatively almost identical to the results of the measurements made on the solid silicon wafer shown in FIG. 2, except for a multiplication factor. Curve 4 shows measurements made after brushing and curve 3 shows measurements made after rinsing. These measurements demonstrate the efficiency of using brushing as compared to a simple rinsing, which holds regardless of the thickness of the layer having a polluted surface.

After brushing the two bonding surfaces of two wafers, the bonding surfaces are brought into intimate contact with each other. Brushing the silicon wafers or oxidized wafers eliminates a large number of large particles, to avoid defects that could make it necessary to declassify the wafers. Wafers are declassified when the bonding quality is insufficient to obtain final structures.

The two wafers are advantageously brought into contact just after brushing without any further treatment step. The molecules present on the bonding surfaces of the two wafers bond together.

Optionally, one or several bonding layers are formed on one or both surfaces to be bonded, to improve the adhesive properties under some conditions (temperatures, chemical treatment, mechanical treatment, etc.). These bonding layer(s) are formed before brushing, and preferably before any other cleaning and/or activation techniques that may be used before brushing. These bonding layers may for example be made of $SiO_2$ (formed by deposition or thermal oxidation), or $Si_3N_4$ (for example formed by deposition).

A heat treatment can then be advantageously applied to increase the molecular forces binding the two wafers. Such a heat treatment may occur at one or several given temperatures and for a predetermined duration to optimize the bonding efficiency and to avoid creating any structural defects on the surface of the wafer.

Heat can be added so that water molecules on the surface of the wafer cause Si—OH bonds and diffusion of water close to the surface of the wafers. Si—OH bonds on a bonding surface of a wafer will bond with hydrogen bonds on the surface of the other wafer, thus forming a bonding force between the two wafers that is sufficiently high to bond the two wafers together.

In further applications after wafer bonding, material removal treatments are advantageously used to remove a large part of one of the two wafers to only keep a remaining surface layer bonded to the second wafer (this surface layer may be, for example, then used as a useful layer for receiving electronic components, or as a substrate for crystal growth of one or several other layers).

For succeeding this removal of material, and according to a first embodiment, a so-called "etch-back" process can be used, which means etching a wafer from the back to retain only the surface layer.

According to a second embodiment, energy, such as a mechanical, thermal or any other form of applied energy, is supplied to cause detachment at an embrittlement zone or zone of weakness contained in the first wafer, so as to only keep the second wafer bonded to the surface layer that is detached from the first wafer. This zone is advantageously formed before bonding, and before the cleaning treatments and the surface activation including brushing, at a determined depth under the first wafer surface to be bonded. This weakness zone is advantageously formed by implantation of atomic species such as hydrogen ions, at a predetermined content and energy. The weakness zone may also advantageously be formed by porosification, i.e., by epitaxially growing a porous thin layer on the surface, and then forming a thin layer wherein the bonding surface is the surface of the thin layer.

If a weakness zone is formed by implantation of atomic species, a heat treatment is advantageously applied after bonding. For example, heat treatment or annealing may be carried out at a temperature of about 500° C. in order to reinforce bonding links by creating covalent Si—O—Si links between the bonded surfaces. Optionally, a heat pre-treatment or pre-annealing may be implemented before annealing.

After the step of removal of material, a surface finish such as chemical etching, sacrificial oxidation, polishing, chemical mechanical planarization (CMP), bombardment of atomic species, or another smoothing technique, is advantageously applied to the detached layer bonded to the second wafer.

The final structure formed from the second wafer bonded to the detached layer is then intended to applications for microelectronics, optics or optoelectronics. For example, it will be possible to form components in the detached layer bonded to the second wafer. Thus, SeOI (Semiconductor On Insulator) structures such as SOI (Silicon On Insulator), SGOI (Silicon-Germanium On Insulator), SOQ (Silicon On Quartz) GeOI (Germanium On Insulator) structures, alloys composed of components belonging to the III-V family can thus be formed on insulator; each having an insulating layer for example such as $SiO_2$ or $Si_3N_4$ inserted between the detached layer and the second wafer. This insulating layer was formed on at least one of the two surfaces to be bonded before bonding, before the surface cleaning and activation steps. In one advantageous case, its particular structure has facilitated bonding forces during bonding and heat treatment, thus assigning an additional role to the bonding layer (apart from being insulating). Thus, it is very easy to make transistors and MEMs.

This invention relates to surface preparation for wafers of any type of material in the semiconductors field, in other words materials belonging the IV atomic family such as silicon or a silicon-germanium alloy, but also includes other types of alloys in the IV-IV, III-V, II-IV family; bonding surfaces made of an insulating material for example such as $SiO_2$ or $Si_3N_4$.

Other components such as doping agents or carbon with a carbon concentration in the layer considered significantly less than or equal to 50%, and more particularly with a concentration less than or equal to 5%, may be added into the semiconductor layers presented in this document. Note that these alloys may be binary, ternary, quaternary or they may have a higher degree.

EXAMPLES

The following examples illustrate preferred embodiments.

Example 1

Figure 4:
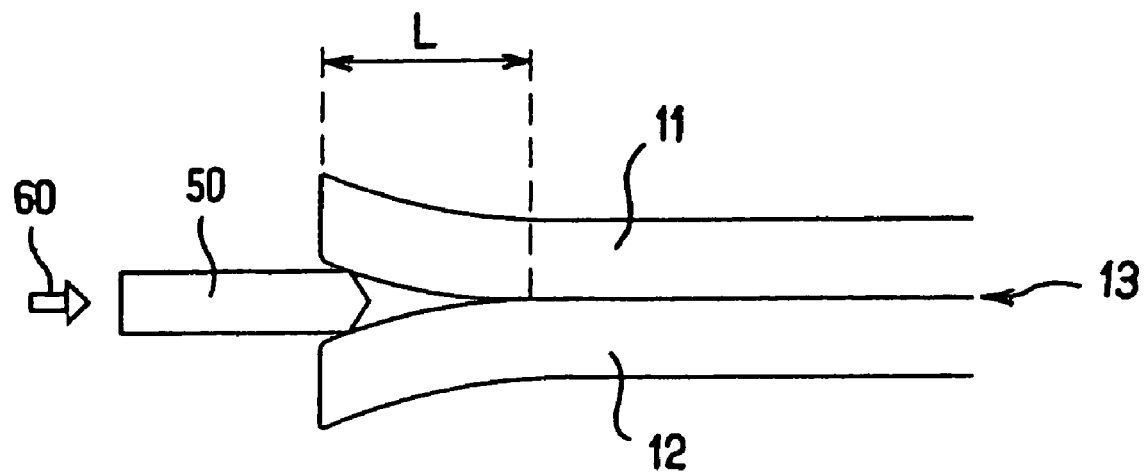
FIG. 4 illustrates a technique for measuring the bonding energy between two wafers.
Figure 5:
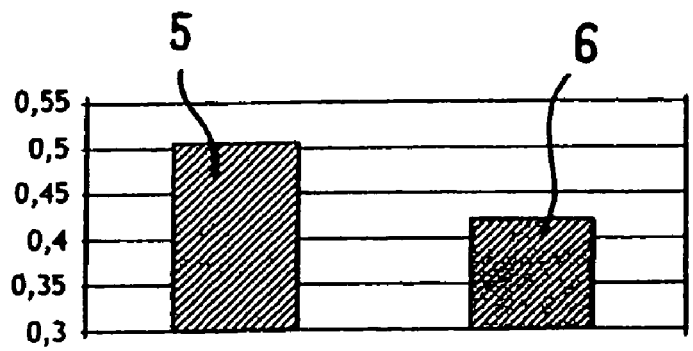
FIG. 5 is a graph comparing two average bonding energies of two wafers, after brushing and without brushing the bonded surfaces prior to bonding.

FIGS. 4 and 5 illustrate the average bonding energy between the two wafers after bringing them into contact and after the heat treatment. Since the measurement of bonding energy is associated with bonding quality, the influence of brushing on bonding quality is demonstrated. To make these measurements, the precise technique for characterization of the bonding strength proposed by W. P. Maszara in an article entitled "Silicon-On-Insulator by Wafer Bonding" ("Journal of Electrochemical Society", vol. 38, No. 1, p. 341 (1998)) was used.

Thus, with reference to FIG. 4, a strip 50 having a thickness was inserted on one or several edges of the bonded wafers 11 and 12 and at the bonding interface 13. A force 60 was applied in a direction approximately parallel to the plane of the interface 13 on the strip at the bonding interface to cause local separation in a zone between the two wafers 11 and 12 and propagation of the separated zone over a certain length L. The length L through which the separation wave passes provides information about the bonding energy between the two wafers. The bonding energy diminishes as the length L of the separated zone increases. The end of separation occurs when there is a balance between the bonding energy and the elastic deformation characterizing the separation.

Thus, an average bonding energy can be determined from the length L of the separated zone. The bonding energy measurements were made and repeated a sufficiently large amount of times to validate the results. Each measurement was made in exactly the same way, and identical strips were applied to the interface between the bonded wafers using the same forces in the same direction. To ensure the reliability of these measurements, it was also important to be sure that the bonding quality was essentially due to the bonding energy between the two wafers and is not disturbed by the presence of residual particles between the wafers. Thus, efficient cleaning operations were conducted on the surfaces of the wafers to be bonded before taking bonding energy measurements.

FIG. 5 shows the measurement results with the bonding energy in Joules per square meter along the ordinate axis. Column 5 shows the bonding energy measured after brushing. Column 6 shows the bonding energy measured without any brushing. The columns show that brushing increases the bonding energy between wafers by about 20% compared with bonded wafers that have not been previously brushed. Brushing wafers immediately before bonding caused an improvement to bonding that was independent of whether or not residual particles were present on the surface of the wafers. Brushing the bonding surfaces eliminates a large amount of contaminants from the surface and activates Si—OH bonds, which activates the bonding surfaces, typically electrochemically, and therefore significantly increases the bonding forces. Thus, brushing improves the cleaning efficiency of the surfaces to be bonded, and also increases the bonding energy.

Such technical information concerning the possibility of activating a surface by brushing means that the importance of brushing to prepare bonding surfaces should be reconsidered. Brushing was used by prior art methods only to clean particles present on the surface of the wafer. However, the technical information derived from the measurements explained above suggest that brushing may have a much more active role in the preparation of wafers before bonding. Furthermore, brushing in general is easier, simpler, faster and more economical to apply than other cleaning and/or surface activation techniques such as the techniques (1), (2), (3) and (4) explained above.

Example 2

Figure 6:
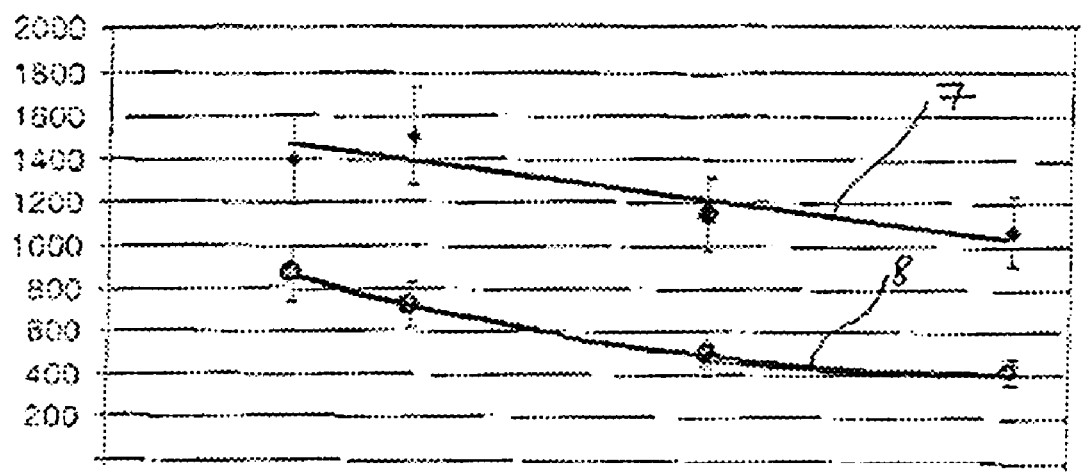
FIG. 6 is a graph to show bonding energies measured between wafers that have been previously submitted to a plasma treatment and to a bonding step, depending on if a brushing was or was not implemented between the plasma treatment and the bonding, with bonding energies being a function of the RF power of the plasma treatment.

FIG. 6 illustrates the measurement of bonding energies between the wafers after their surfaces having been submitted to plasma treatment, then eventually having been brushed, then having been brought in contact and finally having been thermal treated. These measurements have been done on a more of samples of silicon wafers, some of them having been oxidized and other ones having not been oxidized.

The wafer surfaces that are to be joined had been previously cleaned, according to, for example, one of the classical process such as a chemical cleaning (CARO, ozone, RCA solution, or other), brushing or the like. The wafers then were submitted to a plasma treatment in an argon atmosphere, at a pressure of about 100 mT of Argon.

After the plasma treatment, the wafers had been submitted or not to a brushing. In the case of a brushing, an optional step consisting of dipping the wafers in deionized water compartment is implemented between the plasma treatment and the brushing. After the optional step of brushing, the samples of silicon wafers had then brought in contact with oxidized wafer, to be bonded together. The structure thus obtained were then been annealed at about 200° C. during about 2 hours.

The measurements of bonding energies had been realized on this structures in a similar way to those realized in the previous Example 1.

Referring to FIG. 6, the measurement results are shown graphically, with the ordinates being bonding energies in millijoule by meter square, and the abscissa being powers of radiofrequencies (RF) used during the plasma treatments.

Durations of these various treatments by plasma, had been the same between each other, of about 30 seconds. The data thus shows, not only the influence of the brushing upon the bonding energy value, but also the influence of the RF power upon the bonding energy. The curve 7 represents the measurements of bonding energies in the case of a brushing implemented between the plasma treatment and the bonding step. The curve 8 represents the measurements of bonding energies in the case of no brushing was implemented between the plasma treatment and the bonding step.

From a comparison of curves 7 and 8, it can be seen that the implementation of the brushing between the plasma treatment and the bonding step increases the bonding energy between around 40% depending on the RF power which was supplied, the results slightly varying depending on the RF power. In comparison, the results of the Example 1, in which was operated a brushing before the bonding step without previous plasma treatment, the increasing of the bonding energy due to a single brushing was around 20%. Thus, it has surprisingly been demonstrated that the brushing treatment of the present invention results in an increase of the bonding energy which is at least twice that obtained under the influence of a single brushing and without previous plasma treatment operated just before the bonding step. Also, the brushing implemented just before the bonding increases not only the bonding energy, but also changes its value depending on the previous cleaning treatments and/or an activation treatments were previously conducted.

In the present case, considering that the plasma treatment is one of the best treatments for activating a surface of a wafer to bond, it is never-the-less shown in FIG. 7 that by combining a plasma treatment with brushing prior to bonding, very high bonding energies can be obtained (here about 1400 mJ/m² maximum) with an Argon plasma. Another advantage can then be found in operating a brushing just before the bonding and just after a plasma treatment, consisting of the diminution of the influence of the RF power chosen for the plasma treatment, upon the bonding energy. For obtaining a given bonding energy, the RF power can then been chosen among a larger range of RF power.

Therefore, choosing to brush the bonding surface at the end of the wafer preparation process is justified, particularly because it is a simple and fast means of preparing a wafer for bonding and guarantees improved bonding properties. Thus, bonding may occur immediately after brushing, without any intermediate waiting time. Furthermore, brushing causes little or no damage to the surface, in contrast to that caused, for example, by mechanical abrasion or aggressive etching. Thus, a controlled brushing action can obtain a predetermined removal of material from the surface of the wafers to be bonded.

What is claimed is:

1. A method for bonding semiconductor structures together which comprises:
providing a bonding surface on each of two semiconductor structures;
brushing a bonding surface of at least one of the structures to remove contaminants and to activate hydroxyl groups on the bonding surface to enhance hydrophilicity and to facilitate molecular bonding of the structures;
conducting a plasma treatment on the bonding surface before the brushing step; and
joining the bonding surfaces together by molecular bonding to form a composite structure.

2. The method of claim 1 wherein the plasma treatment is conducted after a wet cleaning.

3. The method of claim 2 wherein the plasma treatment is followed by a wet cleaning or a dry cleaning prior to the brushing step.

4. The method of claim 1 which further comprises polishing the bonding surface before the brushing step.

5. The method of claim 4 wherein polishing comprises chemical mechanical polishing.

6. The method of claim 5 wherein the polishing is followed by a wet cleaning or plasma treatment prior to the brushing step.

7. The method of claim 1 which further comprises forming a semiconductor structure by:
forming a zone of a weakness in one of the structures at a predetermined depth below the bonding surface with the depth corresponding approximately to the thickness of a thin layer; and
detaching the thin layer from that structure at the zone of weakness to form the semiconductor structure.

8. The method of claim 7 which further comprises forming the zone of weakness by at least one of implanting atomic species at a predetermined depth or by forming a porous layer in the structure and growing a thin layer of a predetermined thickness.

9. The method of claim 1 which further comprises subjecting the bonding surface to an additional treatment before the brushing step.

10. The method of claim 9 wherein the additional treatment is a cleaning, polishing or activation step that prepares the surface to enhance the effectiveness of the brushing step.

11. The method of claim 1 wherein the plasma treatment is followed by a wet cleaning or a dry cleaning prior to the brushing step.

12. The method of claim 1 wherein both bonding surfaces are brushed to facilitate bonding.

13. The method of claim 1 wherein the brushed bonding surface is part of a bonding layer that is provided on the semiconductor structure before the brushing step.

14. The method of claim 1 which further comprises heat treating the structure to increase the bonding links.

15. The method of claim 1 which further comprises cleaning the bonding surface before the brushing step.

16. The method of claim 15 wherein cleaning comprises wet cleaning.

17. The method of claim 16 wherein wet cleaning includes the use of at least one of ozone, hydrochloric acid, a SC1 solution, a SC2 solution, and a Sulfuric Peroxide Mixture.

18. The method of claim 15 wherein cleaning comprises dry cleaning.

19. The method of claim 18 wherein dry cleaning is based on dry ozone.

* * * * *